United States Patent
Yang et al.

(10) Patent No.: US 8,810,013 B2
(45) Date of Patent: *Aug. 19, 2014

(54) INTEGRATED POWER CONVERTER PACKAGE WITH DIE STACKING

(71) Applicants: Eric Yang, Saratoga, CA (US); Jinghai Zhou, San Jose, CA (US); Hunt Hang Jiang, San Jose, CA (US)

(72) Inventors: Eric Yang, Saratoga, CA (US); Jinghai Zhou, San Jose, CA (US); Hunt Hang Jiang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/890,662

(22) Filed: May 9, 2013

(65) Prior Publication Data

US 2013/0292814 A1    Nov. 7, 2013

Related U.S. Application Data (63) Continuation of application No. 12/886,350, filed on Sep. 20, 2010, now Pat. No. 8,461,669.

(51) Int. Cl.
*H01L 23/495* (2006.01)
*H01L 23/00* (2006.01)
*H01L 25/065* (2006.01)

(52) U.S. Cl.
CPC ........... *H01L 23/49575* (2013.01); *H01L 24/48* (2013.01); *H01L 2225/06558* (2013.01); *H01L 2924/13091* (2013.01); *H01L 2224/16245* (2013.01); *H01L 2224/48247* (2013.01); *H01L 25/0652* (2013.01); *H01L 2224/85439* (2013.01); *H01L 23/49503* (2013.01); *H01L 23/49541* (2013.01)
USPC ............. 257/673; 257/E23.033; 257/E23.052

(58) Field of Classification Search
USPC .......................... 257/673, E23.033, E23.052
See application file for complete search history.

(56) References Cited

U.S. PATENT DOCUMENTS

| | | | |
|---|---|---|---|
| 7,291,869 B2 | 11/2007 | Otremba | |
| 8,022,539 B2 * | 9/2011 | Dahilig et al. | 257/730 |
| 8,134,236 B2 | 3/2012 | Otremba | |
| 8,461,669 B2 * | 6/2013 | Yang et al. | 257/673 |
| 2001/0013643 A1 * | 8/2001 | Nakanishi et al. | 257/678 |
| 2002/0005576 A1 * | 1/2002 | Sakamoto et al. | 257/687 |
| 2004/0212072 A1 * | 10/2004 | Wu | 257/690 |
| 2006/0056213 A1 | 3/2006 | Lee et al. | |
| 2007/0052379 A1 * | 3/2007 | Suh | 318/254 |

* cited by examiner

*Primary Examiner* — Lex Malsawma
(74) *Attorney, Agent, or Firm* — Okamoto & Benedicto LLP (57) ABSTRACT

An integrated circuit for implementing a switch-mode power converter is disclosed. The integrated circuit comprises at least a first semiconductor die having an electrically quiet surface, a second semiconductor die for controlling the operation of said first semiconductor die stacked on said first semiconductor die having said electrically quiet surface and a lead frame structure for supporting said first semiconductor die and electrically coupling said first and second semiconductor dies to external circuitry.

12 Claims, 6 Drawing Sheets

Fig. 1

(prior art)

INTEGRATED POWER CONVERTER PACKAGE WITH DIE STACKING

REFERENCE TO RELATED APPLICATION

This application is a continuation of U.S. application Ser. No. 12/886,350, filed on Sep. 20, 2010, which is incorporated herein by reference in its entirety.

FIELD OF THE INVENTION

This disclosure relates generally to the field of integrated circuit packaging, and more particularly, to integrated circuit packaging with die stacking.

BACKGROUND

The statements in this section merely provide background information related to the present disclosure and may not constitute prior art.

Switched mode power converters are widely used in consumer electronic devices. In most high power applications, switched mode power converters are required either to operate under high power supply voltage or required to deliver quite a large amount of current. In these situations, the power switches of a switched mode power converter must sustain a high voltage or conduct a large current.

Figure 1:
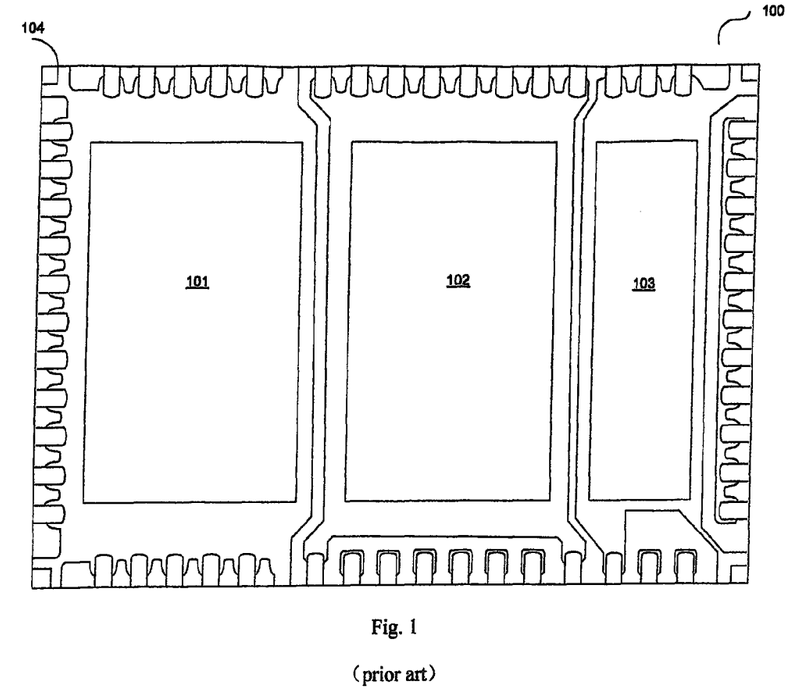
FIG. 1 illustrates a top plan view of a conventional package scheme of a switching power converter.

Currently, high voltage vertical FETs and power MOSFETs comprised of multiple switching elements connected in parallel with each switching element having a large number of fundamental MOSFET transistors laid out successively in parallel and next to one another are used as power switches. For a typical switching power converter 100, which operates under high power supply voltage or delivers quite a large amount of current, comprising a high side power switch 101, a low side power switch 102 and their controller 103, the high side power switch 101, the low side power switch 102 and their controller 103 are fabricated on separate semiconductor dies, and are laid on a lead frame structure 104 in the same plane, as shown in FIG. 1. This conventional method of packaging such a power converter integrated circuit results in larger package size. Furthermore, this conventional method needs to interconnect different semiconductor dies by wire bonding, thereby further introducing high interconnection resistance, parasitic resistance, and parasitic inductance to the integrated circuit.

SUMMARY

In one embodiment, a novel semiconductor device comprises a first semiconductor die having an electrically quiet surface and a second semiconductor die for controlling the operation of said first semiconductor die. The second semiconductor die may be stacked on said first semiconductor die having said electrically quiet surface. The semiconductor device may further comprise a lead frame structure for supporting said first semiconductor die and electrically coupling said first and second semiconductor dies to external circuitry.

These and other features of the present invention will be readily apparent to persons of ordinary skill in the art upon reading the entirety of this disclosure, which includes the accompanying drawings and claims.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of the ordinary skill in the art that the present invention may be practiced without these specific details. In other instances, well-known methods, procedures, components, and circuits have not been described in detail so as not to unnecessarily obscure aspects of the present invention.

Figure 2A:
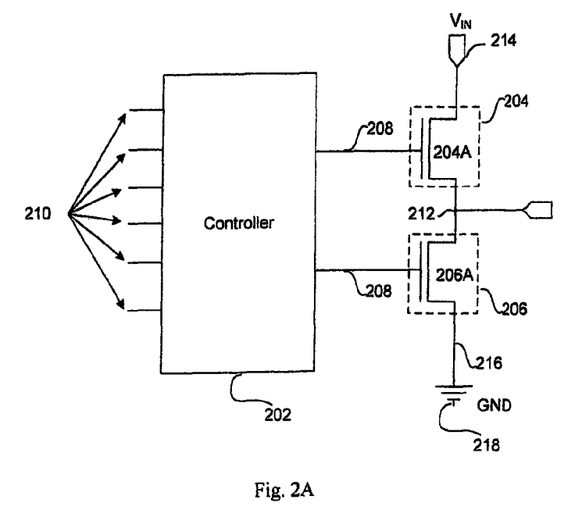
FIG. 2A illustrates a schematic diagram of an exemplary switch-mode power converter in accordance with one embodiment of the present disclosure.

FIG. 2A shows a schematic diagram of an exemplary switch-mode power converter in accordance with an embodiment of the present disclosure. The power converter comprises a controller 202, a first switching device 204 and a second switching device 206. In one embodiment, switching devices 204 and 206 comprise respectively a first high voltage vertical field effect transistor (VFET) 204A and a second high voltage vertical field effect transistor (VFET) 206A.

According to one embodiment of the present disclosure, first VFET 204A is connected in series with second VFET 206A at the source-drain junction. Controller 202 is coupled at its output terminals 208 to deliver control signals respectively to the gate terminals of first VFET 204A and second VFET 206A for driving the VFETs 204A and 206A in switching mode. More particularly, controller 202 may receive system power and control signals at its input terminals 210. The source of first VFET 204A is connected to the drain of second VFET 206A to form a switch terminal (SW) 212. The drain of first VFET 204A is electrically connected to a system input terminal 214 to receive an unregulated input voltage $V_{IN}$. The source of second VFET 206A is coupled to electrical ground terminal 216. Electrical ground terminal 216 is, in turn, electrically connected to electrical ground 218.

Figure 2B:
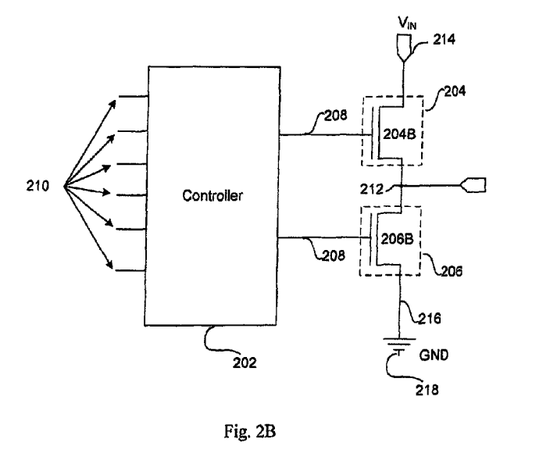
FIG. 2B illustrates a schematic diagram of an exemplary switch-mode power converter in accordance with another embodiment of the present disclosure.

In another embodiment, switching devices 204 and 206 comprise respectively a first power Double Diffused Metal Oxide Semiconductor Field Effect Transistor (DMOSFET) switch 204B and a second power Double Diffused Metal Oxide Semiconductor Field Effect Transistor (DMOSFET) switch 206B, as shown in FIG. 2B. According to one embodiment of the present disclosure, first DMOSFET 204B is connected in series with second DMOSFET 206B at the source-drain junction. Controller 202 is coupled at its output terminals 208 to delivery control signals respectively to the gate terminals of first DMOSFET 204B and second DMOSFET 206B for driving the DMOSFETs 204B and 206B in switching mode. More particularly, controller 202 may receive system power and control signals at its input terminals 210. The source of first DMOSFET 204B is connected to the drain of second DMOSFET 206B to form a switch terminal (SW) 212. The drain of first DMOSFET 204B is electrically connected to a system input terminal 214 to receive an unregulated input voltage V. The source of second DMOSFET 206B is coupled to electrical ground terminal 216. Electrical ground terminal 216 is, in turn, electrically connected to electrical ground 218.

The first and second switching devices 204 and 206 may contain any semiconductor circuitry, which is within the scope of the present invention.

Figure 3:
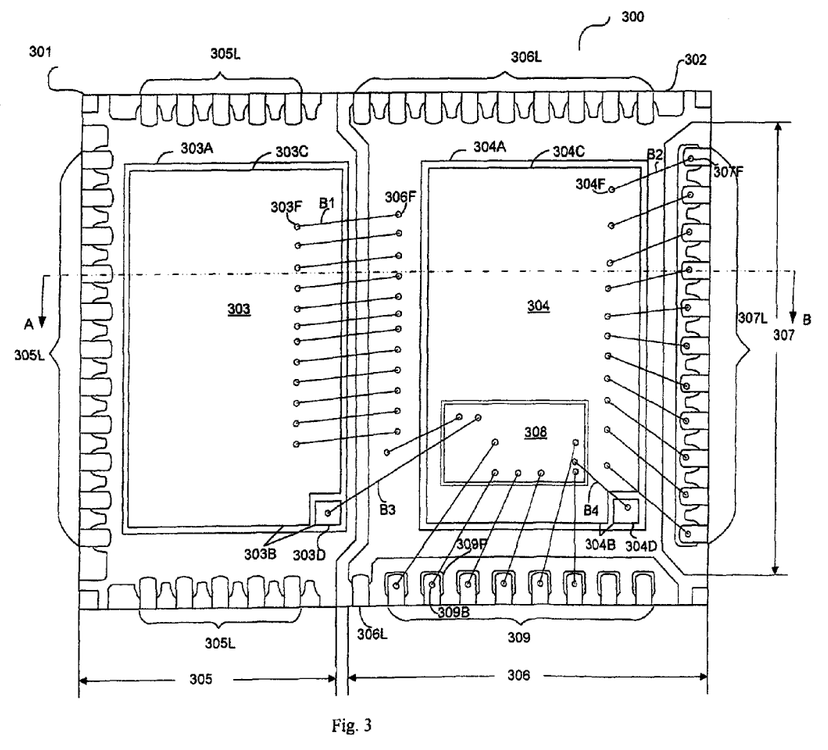
FIG. 3 shows a top plan view of an illustrative embodiment of an integrated circuit (IC) that implements switch-mode power converter illustrated in FIG. 2A in accordance with one embodiment of the present disclosure.

Referring to FIG. 3, a top plan view of an illustrative embodiment of an integrated circuit (IC) 300 that implements switch-mode power converter illustrated in FIG. 2A is depicted. As shown in FIG. 3, integrated circuit 300 includes a lead frame structure 301 adapted to support said first and second high voltage VFETs 204A and 206A, all being encapsulated by a molding material 302. Lead frame structure 301 is the metal 'skeleton' that provides both mechanical support and a means for electrical communication between chip leads and integrated circuit dies encapsulated in the chip. According to one embodiment of the present disclosure, said first high voltage VFET 204A is formed on a first die 303 and said second high voltage VFET 206A is formed on a second die 304. Lead frame structure 301 is a metal frame comprising a first section 305 for supporting the first die 303 and a second section 306 for supporting the second die 304. More particularly, the drain of the first high voltage VFET 204A is formed at a lower layer 303A of the first die 303, the source of the first high voltage VFET 204A is formed on a large area 303C at an upper layer 303B of the first die 303, the gate of the first high voltage VFET 204A is formed on a small area 303D at the upper layer 303B and is separated from the area 303C, the drain of the first high voltage VFET 204A is connected to the first section 305 of the lead frame structure 301 at the bottom surface of said lower layer 303A; the drain of the second high voltage VFET 206A is formed at a lower layer 304A of the second die 304, the source of the second high voltage VFET 206A is formed on a large area 304C at an upper layer 304B of the second die 304, the gate of the second high voltage VFET 206A is formed on a small area 304D at the upper layer 304B and is separated from the area 304C, the drain of the second high voltage VFET 206A is connected to the second section 306 of the lead frame structure 301 at the bottom surface of said lower layer 304A. First section 305 of lead frame structure 301 further comprises an electrical lead 305L, which is arranged on the sides (left side, top side and bottom side) of first section 305 that are not adjacent to the second section 306. Electrical lead 305L is configured to receive unregulated input voltage $V_{IN}$, which may be a rather high voltage, such as 100V according to one embodiment of the present disclosure. Second section 306 of lead frame structure 301 further comprises an electrical lead 306L, which is arranged on the top side of the second section 306. Electrical lead 306L is configured as the switch terminal (SW) 212 of the switch-mode power converter illustrated in FIG. 2A. According to one embodiment of the present disclosure, the top surface of the large area 303C of the first die 303 is connected to the second section 306 via bonding wires B1, so that the source of the first high voltage VFET 204A is electrically coupled to the switch terminal (SW) 212. On the large area 303C of the first die 303, bonding wires B1 are bonded on bonding sites 303F, which are formed on the right hand side of the large area 303C. On the second section 306, bonding wires B1 are bonded on bonding sites 306F, which are formed on the left hand side of the second section 306.

Continuing with FIG. 3, lead frame structure 301 further comprises a third section 307, which is a rectangular metal structure formed on the right hand side of lead frame structure 301. Third section 307 comprises an electrical lead 307L, which is configured as the electrical ground terminal 216 of the switch-mode power converter illustrated in FIG. 2A. According to one embodiment of the present disclosure, the top surface of the large area 304C of the second die 304 is connected to the third section 307 via bonding wires B2, so that the source of the second high voltage VFET 206A is electrically coupled to the electrical lead 307L, which in practical application is connected to electrical ground. On the large area 304C of the second die 304, bonding wires B2 are bonded on bonding sites 304F, which are formed on the right hand side of the large area 304C. On the third section 307, bonding wires B2 are bonded on bonding sites 307F, which are formed on the left hand side of the third section 307.

Continuing with FIG. 3, as an exemplary embodiment, a third die 308 which may contain the control circuitry of the first and second high voltage VFETs 204A and 206A, such as the controller 202 illustrated in FIG. 2A, and other periphery circuitry, such as protection circuit, internal reference voltage generation circuit etc., is vertically stacked on the second die 304. More particularly, the third die 308 is stacked on the second die 304 with its die substrate attached to the top surface of the large area 304C of the second die 304. In such configuration, since the top surface of the large area 304C of the second die 304 is electrically connected to electrical ground, and thus is electrically quiet, i.e., relatively noise free, the control circuitry and other periphery circuitry formed on the third die 308 nearly suffer no noise generated from the first and second dies 303 and 304. Thus, no special insulation material is needed between the third die 308 and the second die 304. The third die 308 is connected to the first die 303 and the second die 304 via bonding wires B3 and B4 respectively for providing control signals to drive the gates of the first and second high voltage VFETs 204A and 206A. Bonding sites are formed on the small area 303D of the first die 303, on the small area 304D of the second die 304 and on the top surface of the third die 308 for bonding the bonding wires B3 and B4 to respectively the first die 303, the second die 304 and the third die 308.

Continuing with FIG. 3, lead frame structure 301 further comprises a plurality of input/output (I/O) electrical leads 309. Each of electrical leads 309 is a single metal that also comprises a contact pad 309P and a bonding site 309B, where third die 308 makes electrical contacts to electrical leads 309 via bonding wires, for example. Electrical leads 309 provide electrical communications between the third die 308 and external circuitry. It is to be understood that the number of electrical leads 309 is variable for different applications, and the input/output signals received and provided by the electrical leads 309 depend on specific functions that the integrated circuit 300 implements.

Figure 4:
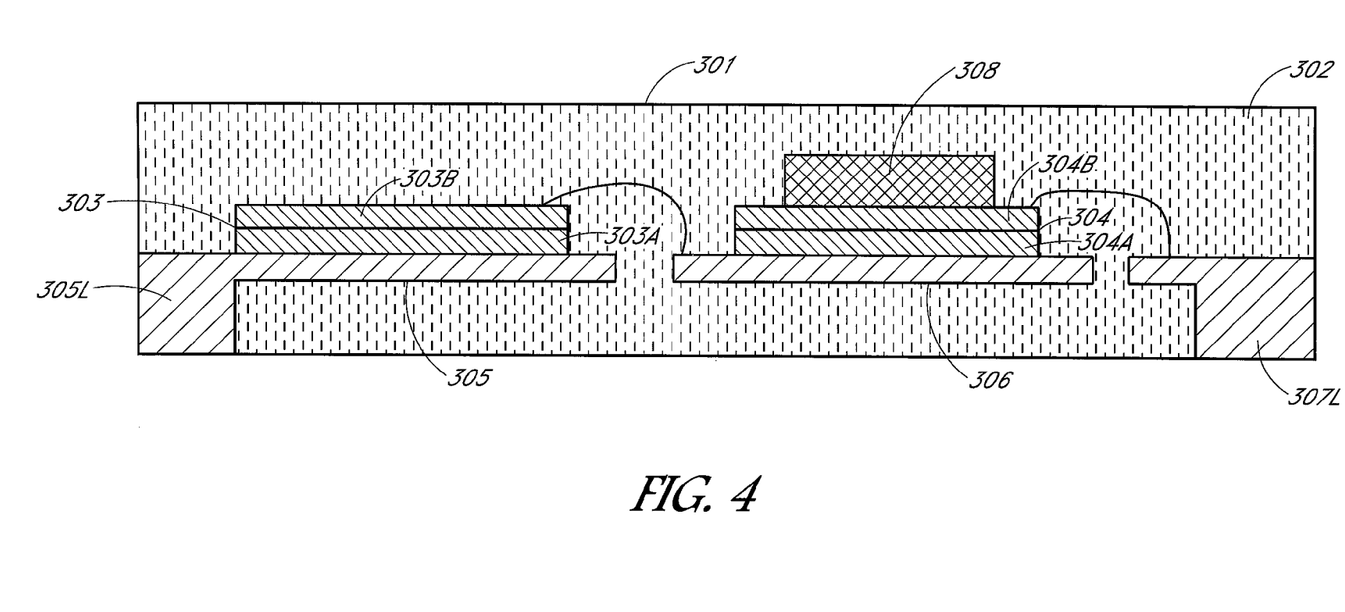
FIG. 4 shows a cross sectional view of the integrated circuit of FIG. 3 taken along AB axis in accordance with one embodiment of the present disclosure.

Referring to FIG. 4, a cross sectional view of integrated circuit 300 of FIG. 3 taken along AB axis is illustrated. First die 303 is attached to the first section 305 of lead frame structure 301 so that the first die 303 is electrically coupled to external circuitry through electrical lead 305L. The lower layer 303A and the upper layer 303B respectively comprise the drain and source of the first high voltage VFET 204A. Second die 304 is attached to the second section 306 of lead frame structure 301 so that the second die 304 is electrically coupled to external circuitry through electrical lead 306L (see FIG. 3). The lower layer 304A and the upper layer 304B respectively comprise the drain and source of the second high voltage VFET 206A. The top surface of the upper layer 303A of the first die 303 is electrically coupled to the second section 306 of the lead frame structure 301 through bonding wires so that the source of the first high voltage VFET 204A can make communications with external circuitry. The top surface of the upper layer 304A of the second die 304 is electrically coupled to the third section 307 of the lead frame structure 301 through bonding wires so that the source of the second high voltage VFET 206A can make communications with external circuitry. In this particular exemplary embodiment, the first section 305 of the lead frame structure 301 is electrically coupled to receive an unregulated power supply voltage $V_{IN}$ through the electrical lead 305L, the second section 306 of the lead frame structure 301 is electrically coupled to electrical lead 306L which functions as a switching terminal, and the third section 307 of the lead frame structure 301 is electrically coupled to electrical ground through the electrical lead 307L. Thus, the top surface of the second die 304 is electrically connected to electrical ground and is electrically quiet. Third die 308 is stacked on the second die 304 with its die substrate attached to the top surface of the second die 304, and no special insulation material is needed between the second die 304 and the third die 308. The semiconductor dies 303, 304 and 308 and the lead frame structure 301 are encapsulated by molding compound material 302, leaving the electrical leads 305L, 306L, 307L and 309 exposed at the surface. The integrated circuit 300 for power converter can be encapsulated into a quad flat leadless (QFN) package in one embodiment. The lead frame structure 301 can also be a leaded lead frame structure such as small outline package (SOP), shrink small outline package (SSOP) and thin shrink small outline package (TSSOP), or any suitable package types.

Figure 5:
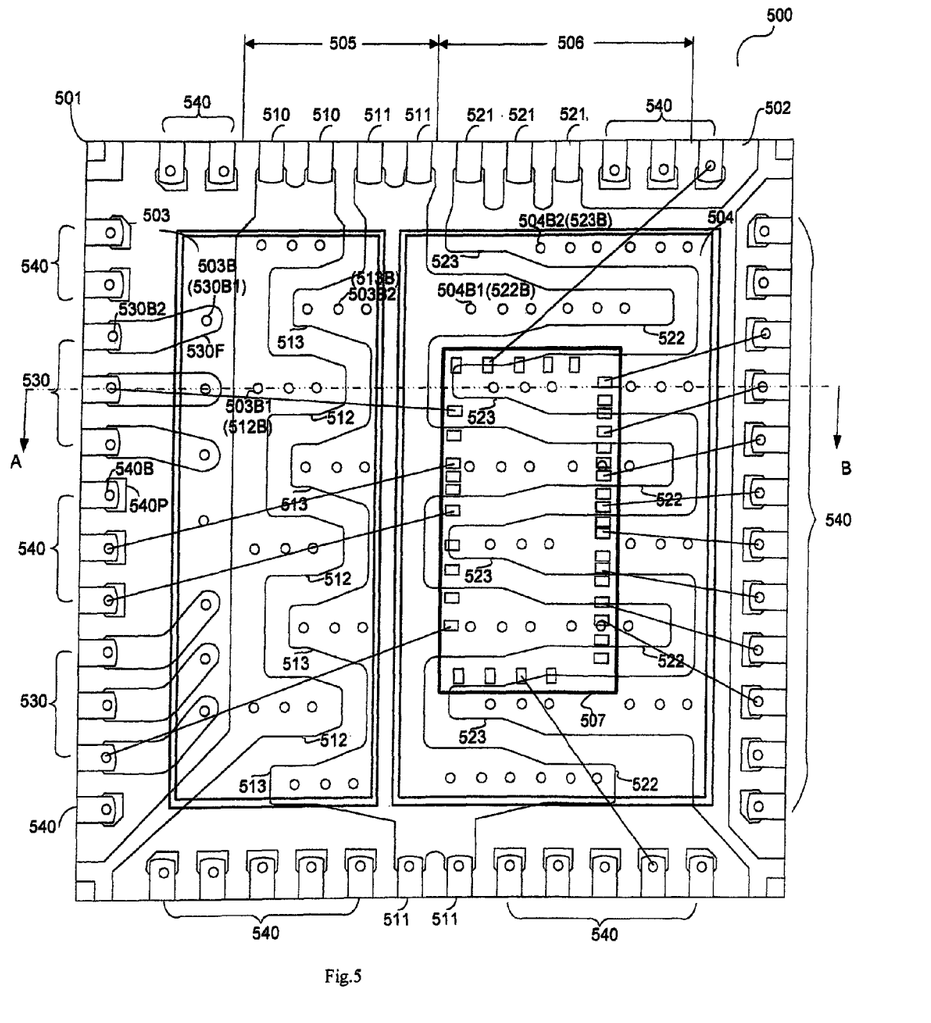
FIG. 5 shows a top plan view of an illustrative embodiment of an integrated circuit (IC) that implements switch-mode power converter illustrated in FIG. 2B in accordance with one embodiment of the present disclosure.

Referring to FIG. 5, a top plan view of an illustrative embodiment of an integrated circuit (IC) 500 that implements switch-mode power converter illustrated in FIG. 2B is depicted. As shown in FIG. 5, integrated circuit 500 includes a lead frame structure 501 adapted to support said first and second high voltage VFETs 204A and 206A, all being encapsulated by a molding material 502. Lead frame structure 501 is the metal 'skeleton' that provides both mechanical support and a means for electrical communication between chip leads and integrated circuit dies encapsulated in the chip. According to one embodiment of the present disclosure, said first DMOSFET 204B is formed on a first flip-chip die 503, and said second DMOSFET 206B is formed on a second flip-chip die 504. Lead frame structure 501 is a metal frame comprises a first section 505 for supporting the first flip-chip die 503 and a second section 506 for supporting the second flip-chip die 504. It is to be understood that lead frame structure 501 capable of supporting a single flip-chip die having first and second DMOSFETs 204B and 206B are within the scope of the present disclosure.

Continuing with FIG. 5, first section 505 further includes a first electrical lead 510, a second electrical lead 511, a first plurality of finger shaped structures 512 unilaterally extended from the first electrical lead 510 to the right, and a second plurality of finger shaped structures 513 unilaterally extended from the second electrical lead 511 to the left. First electrical lead 510 acts as the input terminal 214 for receiving an unregulated input voltage $V_{IN}$ illustrated in FIG. 2B. Second electrical lead 511 acts as the switching terminal 212 illustrated in FIG. 2B. According to one embodiment of the present disclosure, first DMOSFET 204B formed on the first flip-chip die 503 comprises multiple high side switching elements connected in parallel, also second DMOSFET 206B formed on the second flip-chip die 504 comprises multiple low side switching elements connected in parallel. Each high side and low side switching element includes a large number of discrete DMOS transistors laid out successively in parallel and next to one another. In one embodiment, conductive coupling elements 503B1 and 503B2 which act respectively as the electrical contacts of the drain terminal and the source terminal of the high side switching elements are attached to the top surface of the first flip-chip die 503 and are electrically coupled to the first section 505 of the lead frame structure 501. In one embodiment, on the first plurality of finger shaped structures 512 and second plurality of finger shaped structures 513, there are respectively electrical contact sites 512B and 513B, which are positioned to contact the conductive coupling elements 503B1 and 503B2 respectively. As such, the drain of the high side switching elements of the first DMOSFET 204B is coupled to the first electrical lead 510, and the source of the high side switching elements of the first DMOSFET 204B is coupled to the second electrical lead 511. However, it should be understood that in other embodiment, electrical contact sites, such as 512B and 513B, are not necessarily needed for the conductive coupling elements, such as 503B1 and 503B2, making electrical contact with the finger shaped structures 512 and 513, depending on the structure/material type selection of the conductive coupling elements 503B1 and 503B2. For example, if the conductive coupling elements, such as 503B1 and 503B2, are chosen to be Cu/Sn pillar bumps, electrical contact sites, such as 512B and 513B, are not needed; if the conductive coupling elements, such as 503B1 and 503B2, are chosen to be solder bumps, electrical contact sites, such as 512B and 513B, are needed, which are typically Ag plated areas. In various embodiments, the conductive coupling elements 503B1 and 503B2 may include conductive solder bumps, pillar bumps, pins, suds, other structures to establish a conductive connection, or any combination thereof. In the particular embodiment shown in FIG. 5, the conductive coupling elements 503B1 and 503B2 are flip-chip Cu/Sn pillar bumps. In other embodiments, the conductive coupling elements 503B1 and 503B2 may be electrically isolated from one another to enable independent parallel electrical paths between the first flip-chip die 503 and the lead frame structure 501.

Similarly, second section 506 further includes a third electrical lead 521, a third plurality of finger shaped structures 522 unilaterally extended from the second electrical lead 511 to the right, and a fourth plurality of finger shaped structures 523 unilaterally extended from the third electrical lead 521 to the left. Third electrical lead 521 acts as the electrical ground terminal 216 illustrated in FIG. 2B. According to one embodiment of the present disclosure, conductive coupling elements 504B1 and 504B2 which act respectively as the electrical contacts of the drain terminal and the source terminal of the low side switching elements are attached to the top surface of the second flip-chip die 504 and are electrically coupled to the second section 506 of the lead frame structure 501. In one embodiment, on the third plurality of finger shaped structures 522 and fourth plurality of finger shaped structures 523, there are respectively electrical contact sites 522B and 523B, which are positioned to contact the conductive coupling elements 504B1 and 504B2 respectively. As such, the drain of the low side switching elements of the second DMOSFET 206B is coupled to the second electrical lead 511, and the source of the low side switching elements of the second DMOSFET 206B is coupled to the third electrical lead 521. However, it should be understood that in other embodiment, electrical contact sites, such as 522B and 523B, are not necessarily needed for the conductive coupling elements, such as 504B1 and 504B2, making electrical contact with the finger shaped structures 522 and 523, depending on the structure/material type selection of the conductive coupling elements 504B1 and 504B2. For example, if the conductive coupling elements, such as 504B1 and 504B2, are chosen to be Cu/Sn pillar bumps, electrical contact sites, such as 522B and 523B, are not needed; if the conductive coupling elements, such as 504B1 and 504B2, are chosen to be solder bumps, electrical contact sites, such as 522B and 523B, are needed, which are typically Ag plated areas. In various embodiments, the conductive coupling elements 504B1 and 504B2 may include conductive solder bumps, pillar bumps, pins, suds, other structures to establish a conductive connection, or any combination thereof. In the particular embodiment shown in FIG. 5, the conductive coupling elements 503B1 and 503B2 are flip-chip Cu/Sn bumps. In other Embodiments, the conductive coupling elements 504B1 and 504B2 may be electrically isolated from one another to enable independent parallel electrical paths between the second flip-chip die 504 and the lead frame structure 501.

Continuing with FIG. 5, integrated circuit 500 further comprises a third die 507, which may comprise the control circuitry of the first and second DMOSFETs 204B and 206B, such as the controller 202 illustrated in FIG. 2B, and other periphery circuitry, such as protection circuits, internal reference voltage generation circuits etc. According to one embodiment of the present disclosure, third die 507 may be vertically stacked on the first flip-chip die 503 with its die substrate attached to the bottom surface of the first flip-chip die 503. As an alternative embodiment, third die 507 may be vertically stacked on the second flip-chip die 504 with its die substrate attached to the bottom surface of the second flip-chip die 504. In such configuration, since the bottom surface of either the first flip-chip die 503 or the second flip-chip die 504 is electrically connected to electrical ground, and thus is electrically quiet, the control circuitry and other periphery circuitry formed on the third die 507 nearly suffer no noise generated from the first or second flip-chip dies 503 and 504. Thus, no special insulation material is needed between the third die 507 and the first flip-chip die 503 or the second flip-chip die 504.

Continuing with FIG. 5, lead frame structure 501 further comprises a first plurality of electrical leads 530, and a second plurality of electrical leads 540, which are arranged on the four sides (top side, bottom side, left side and right side) of the the lead frame structure 501. According to one embodiment of the present disclosure, each of the first plurality of electrical leads 530 is a single metal that also comprises a lead finger 530F and a first electrical contact site 530B1 formed near the end of lead finger 530F, where first flip-chip die 503 and second flip-chip die 504 make electrical contacts to electrical leads 530 via electrical coupling elements, such as 503B. Similar to the electrical sites 512B/513B, electrical contact sites 530B1 are not necessarily needed depending on the structure/material type selection of the conductive coupling elements 503B, Each of the first plurality of electrical leads 530 may further comprise a second bonding site 530B2 formed near the beginning of lead finger 530F, where third die 507 makes electrical contacts to electrical leads 530 via bonding wires, for example. In one embodiment, first plurality of electrical leads 530 are formed to function as input/output electrical leads for receiving supply voltages, control signals and drive signals from external circuitry or from control circuitry and other periphery circuitry formed on third die 507, and providing input and output signals such as supply voltages, control signals and drive signals to first and second DMOSFETs 204B and 206B formed respectively on said first and second flip-chip dies 503 and 504. In one embodiment, first plurality of electrical leads 530 further function as input/output electrical leads for receiving input and output signals such as supply voltages, control signals and other electrical signals from external circuitry or from said first and second flip-chip die 503 and 504, and providing supply voltages, control signals and other electrical signals to control circuitry and other periphery circuitry formed on third die 507. Therefore, according to one embodiment of the present disclosure, first plurality of electrical leads 530 not only provide electrical paths between external circuitry and integrated circuit 500, but also provide electrical paths between DMOSFETs 204B and 206B formed respectively on first and second flip-chip dies 503 and 504 and control circuitry and other periphery circuitry formed on third die 507. According to one embodiment of the present disclosure, each of the second plurality of electrical leads 540 is a single metal that also comprises a contact pad 540P and a bonding site 540B, where third die 507 makes electrical contacts to electrical leads 540 via bonding wires, for example. In one embodiment, second plurality of electrical leads 540 are formed to function as other input/output electrical leads for providing input/output signals such as supply voltages, control signals and other electrical signals to third die 507, so that electrical paths between external circuitry and the control circuitry and other periphery circuitry formed on third die 507 are established. It is to be understood that the number of first and second plurality of electrical leads 530 and 540 are variable for different applications, and the input/output signals received and provided by first and second plurality of electrical leads 530 and 540 depend on specific functions that the integrated circuit 500 implements.

Figure 6:
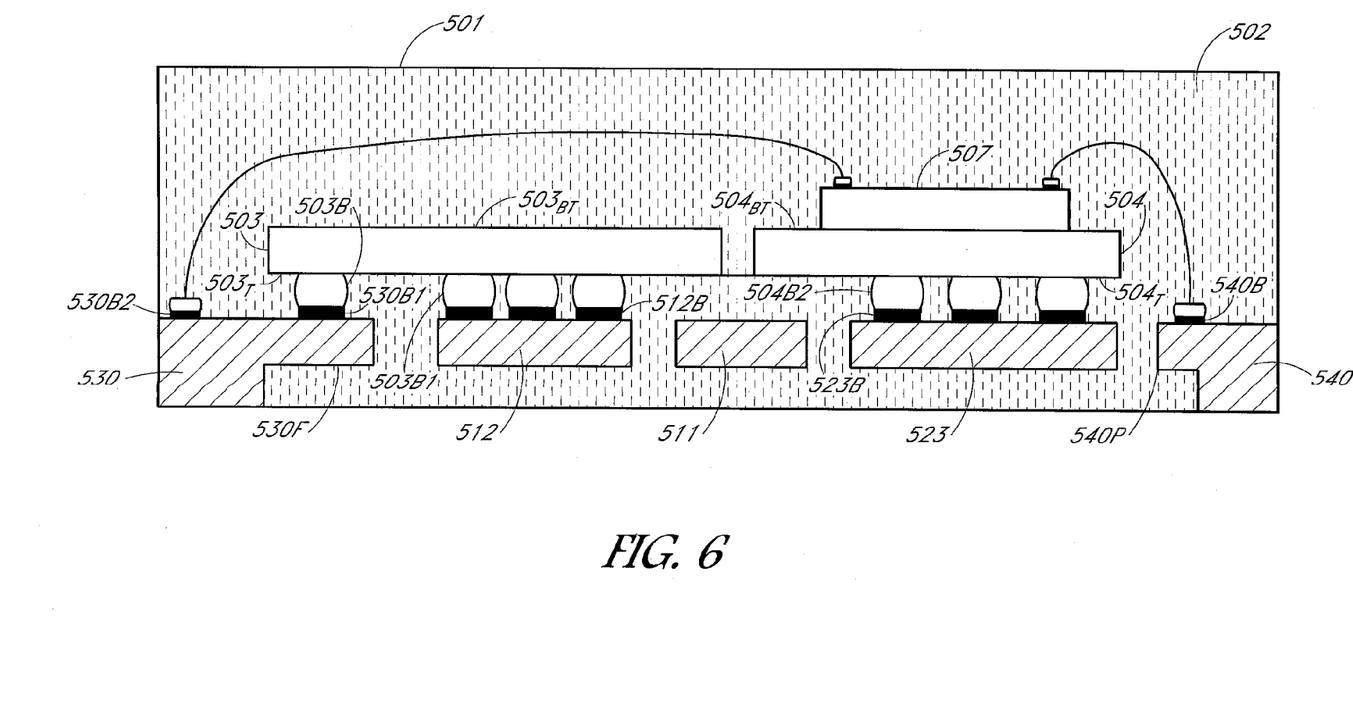
FIG. 6 shows a cross sectional view of the integrated circuit of FIG. 5 taken along AB axis in accordance with one embodiment of the present disclosure.

Now referring to FIG. 6, a cross-sectional view of integrated circuit 500 of FIG. 5 taken along AB axis is illustrated. The first flip-chip die 503 is faced down with top surface $503_T$ coupled to the lead frame structure 501 through conductive coupling elements 503B, 503B1 and 503B2 at respectively the electrical contact sites 530B1 formed near the end of the lead fingers 530F of electrical leads 530, 512B formed on the first plurality of finger shaped structures 512 and 513B formed on the second plurality of finger shaped structures 513. The second flip-chip die 504 is faced down with top surface $504_T$ coupled to the lead frame structure 501 through conductive coupling elements 504B1 and 504B2 at respectively the electrical contact sites 522B and 523B. The third die 507 is stacked on the second flip-chip die 504 with its die substrate attached to the bottom surface $504_{BT}$. Further, the third die 507 also makes electrical contact with the first plurality of electrical leads 530 via bonding wires at bonding sites 530B2 formed near the beginning of the lead fingers 530F of electrical leads 530. The third die 507 further makes electrical contact with a second plurality of electrical leads 540 via bonding wires at bonding sites 540B formed on contact pads 540P of electrical leads 540. In FIG. 5, electrical conductive element 503B2 and electrical contact site 513B are not shown because they are hidden by the first plurality of finger shaped structures 512 when seen in from the AB axis. Also electrical conductive element 504B1 and electrical contact site 522B are not shown because they are hidden by the fourth plurality of finger shaped structures 523 seen in from the AB axis. It is to be understood that, the cross-sectional view of integrated circuit 500 in FIG. 5 is just for purpose of illustration, As set forth previously, lead frame structure 501 does not necessarily comprise electrical contact sites, such as 530B1, 512B/513B, 522B/523B. In that case, such elements will not be shown in FIG. 5. The semiconductor dies 503, 504 and 507 and the lead frame structure 501 are encapsulated by molding compound material 502, leaving the electrical leads 510, 511, 521, 530 and 540 exposed at the surface. The integrated circuit 500 for power converter can be encapsulated into a quad flat leadless (QFN) package in one embodiment. The lead frame structure 301 can also be a leaded lead frame structure such as small outline package (SOP), shrink small outline package (SSOP) and thin shrink small outline package (TSSOP), or any suitable package types.

Figure 7:
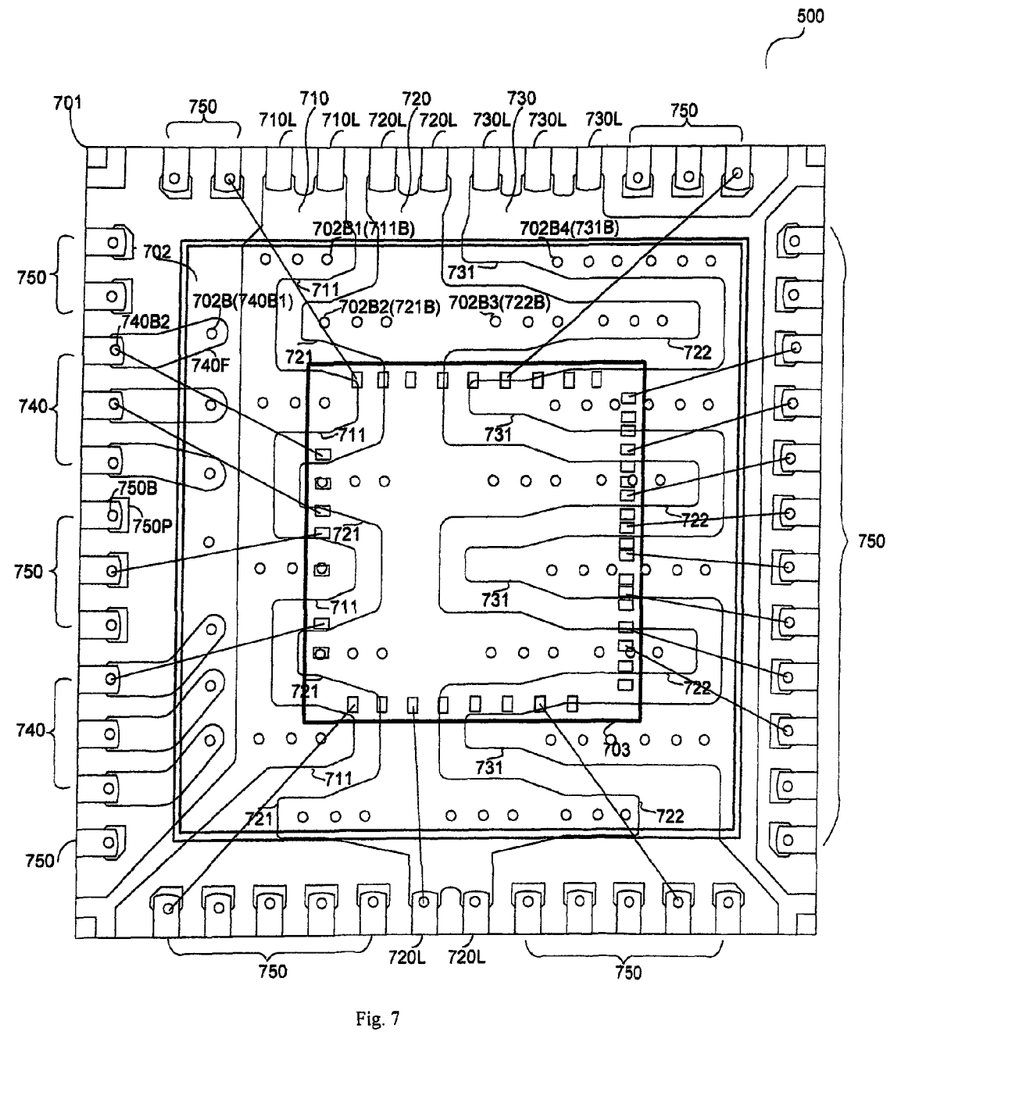
FIG. 7 shows a top plan view of an illustrative embodiment of an integrated circuit (IC) that implements switch-mode power converter illustrated in FIG. 2B in accordance with another embodiment of the present disclosure.

Now referring with FIG. 7, a top plan view of an illustrative embodiment of an integrated circuit (IC) 700 that implements switch-mode power converter illustrated in FIG. 2B is depicted. Integrated circuit 700 includes a lead frame structure 701, a first die 702 and a second die 703. Lead frame structure 701 is the same as lead frame structure 501 shown in FIG. 5 except that lead frame structure 701 supports the first and second DMOSFETs 204B and 206B laid out on a single die 702. In one embodiment, first die 702 is a semiconductor flip-chip die which is divided into a first section for fabricating first DMOSFET 204B, which comprises multiple high side switching elements connected in parallel, and a second section for fabricating second DMOSFET 206B, which comprises multiple low side switching elements connected in parallel. Each high side and low side switching element includes a large number of discrete DMOS transistors laid out successively in parallel and next to one another. Lead frame structure 701 comprises a first part 710, a second part 720 and a third part 730. First part 710 acts as the input terminal 214 for receiving an unregulated input voltage $V_{IN}$ shown in FIG. 2B, second part 720 acts as the switch terminal (SW) 212 and third part 730 acts as the electrical ground terminal 216. First part 710 comprises a first plurality of finger shaped structures 711 extended unilaterally to the right, where the high side switching elements have their drain electrically coupled to the first part 710 via conductive coupling elements 702B1. On the first plurality of finger shaped structures 711, there are electrical contact sites 711B which are positioned to contact the conductive coupling elements 702B1, so that the drain of the high side switching elements is coupled the first part 710, thus to unregulated input voltage $V_{IN}$. Second part 720 comprises a second plurality of finger shaped structures 721 extended unilaterally to the left, where the high side switching elements have their source electrically coupled to the second part 720 via conductive coupling elements 702B2. On the second plurality of finger shaped structures 721, there are electrical contact sites 721B which are positioned to contact the conductive coupling elements 702B2, so that the source of the high side switching elements is coupled to the second part 720, thus to the switching terminal (SW). Second part 720 further comprises a third plurality of finger shaped structures 722 extended unilaterally to the right, where the low side switching elements have their drain electrically coupled to the second part 720 via conductive coupling elements 702B3. On the third plurality of finger shaped structures 722, there are electrical contact sites 722B which are positioned to contact the conductive coupling elements 702B3, so that the drain of the low side switching elements is coupled to the second part 720, thus to the switching terminal (SW). Third part 730 comprises a fourth plurality of finger shaped structures 731 extended unilaterally to the left, where the low side switching elements have their source electrically coupled to the third part 730 via conductive coupling elements 702B4. On the fourth plurality of finger shaped structures 731, there are electrical contact sites 731B which are positioned to contact the conductive coupling elements 702B4, so that the source of the low side switching elements is coupled to the third part 730, thus to the electrical ground terminal. It is to be understood that in various embodiment, electrical contact sites, such as 711B, 721B, 722B and 731B, are not necessarily needed for the conductive coupling elements, such as 702B1, 702B2, 702B3 and 702B4, making electrical contact with the finger shaped structures 711, 721, 722 and 731, depending on the structure/material type selection of the conductive coupling elements 702B1, 702B2, 702B3 and 702B4. For example, if the conductive coupling elements, such as 702B1, 702B2, 702B3 and 702B4 are chosen to be Cu/Sn pillar bumps, electrical contact sites, such as 711B, 721B, 722B and 731B, are not needed; if the conductive coupling elements, such as 702B1, 702B2, 702B3 and 702B4, are chosen to be solder bumps, electrical contact sites, such as 711B, 721B, 722B and 731B, are needed, which are typically Ag plated areas. In various embodiments, the conductive coupling elements 702B1-702B4 may include conductive solder bumps, pillar bumps, pins, suds, other structures to establish a conductive connection, or any combination thereof. In the particular embodiment shown in FIG. 7, the conductive coupling elements 702B1-702B4 are flip-chip Cu/Sn pillar bumps. In other embodiments, the conductive coupling elements 702B1-702B4 may be electrically isolated from one another to enable independent parallel electrical paths between the first flip-chip die 702 and the lead frame structure 701.

Continuing with FIG. 7, electrical leads 710L, 720L and 730L are formed respectively on the first part 710, second part 720 and third part 730, which function respectively as the input terminal 214, the switching terminal (SW) 212 and the electrical ground terminal 216 to electrically couple the semiconductor flip-chip die 702 with external circuits.

Continuing with FIG. 7, second die 703 may be vertically stacked on the first die 702 with its die substrate attached to the bottom surface of the faced down flip-chip die 702. Second die 703 may comprise control circuitry of the first and second DMOSFETs 204B and 206B, such as the controller 202 illustrated in FIG. 2B, and other periphery circuitry, such as protection circuits, internal reference voltage generation circuits etc. In such configuration, since the bottom surface of the flip-chip die 702 is connected to electrical ground, and thus is electrically quiet, the control circuitry and other periphery circuitry formed on the third die 703 nearly suffer no noise generated from the first flip-chip die 702. Thus, no special insulation material is needed between the first die 702 and the second die 703.

Continuing with FIG. 7, lead frame structure 701 further comprises a first plurality of electrical leads 740, and a second plurality of electrical leads 750, which are arranged on the four sides (top side, bottom side, left side and right side) of the lead frame structure 701. According to one embodiment of the present disclosure, each of the first plurality of electrical leads 740 is a single metal that also comprises a lead finger 740F and a first electrical contact site 740B1 formed near the end of lead finger 740F, where first die 702 makes electrical contacts to electrical leads 740 via electrical coupling elements 702B. It is to be understood that electrical contact sites 740B1 are not necessarily needed depending on the structure/ material type selection of the conductive coupling elements 702B. Each of the first plurality of electrical leads 740 may further comprises a second bonding site 740B2 formed near the beginning of lead finger 740F, where second die 703 makes electrical contacts to electrical leads 740 via bonding wires, for example. In one embodiment, first plurality of electrical leads 740 are formed to function as input/output electrical leads for receiving supply voltages, control signals and drive signals from external circuits or from control circuits and other periphery circuits formed on second die 703, and providing input and output signals such as supply voltages, control signals and drive signals to first and second DMOSFETs 204B and 206B formed on said first die 702. In one embodiment, first plurality of electrical leads 530 further function as input/output electrical leads for receiving input and output signals such as supply voltages, control signals and other electrical signals from external circuits or from said first die 702, and providing supply voltages, control signals and other electrical signals to control circuits and other periphery circuits formed on second die 703. Therefore, according to one embodiment of the present disclosure, first plurality of electrical leads 740 not only provide electrical paths between external circuits and integrated circuit 700, but also provide electrical paths between DMOSFETs 204B and 206B formed on first die 702 and control circuits and other periphery circuits formed on second die 703. According to one embodiment of the present disclosure, each of the second plurality of electrical leads 750 is a single metal that also comprises a contact pad 750P and a bonding site 750B, where second die 703 makes electrical contacts to electrical leads 750 via bonding wires, for example. In one embodiment, second plurality of electrical leads 750 are formed to function as other input/output electrical leads for providing input/ output signals such as supply voltages, control signals and other electrical signals to second die 703, so that electrical paths between external circuits and the control circuits and other periphery circuits formed on second die 703 are established. It is to be understood that the number of first and second plurality of electrical leads 740 and 750 are variable for different applications, and the input/output signals received and provided by first and second plurality of electrical leads 740 and 750 depend on specific functions that the integrated circuit 700 implements.

The integrated circuit 700 for power converter can be encapsulated into a quad flat leadless (QFN) package in one embodiment. The lead frame structure 301 can also be a leaded lead frame structure such as small outline package (SOP), shrink small outline package (SSOP) and thin shrink small outline package (TSSOP), or any suitable package types.

The above detailed description of the embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

Although the integrated circuits discussed above relate to switch mode power converters, the present invention is also applicable to class D audio amplifiers, motor controls, LED drivers and similar power devices.

It will be appreciated that specific embodiments of the present disclosure have been described for purposes of illustration only, but that various modifications may be made without deviating from the spirit and scope of the invention. Accordingly, the invention is not limited except as by the appended claims.

What is claimed is:

1. A semiconductor device comprising:
   a first semiconductor die comprising a first switching device;
   a second semiconductor die comprising a second switching device, the second semiconductor die having a top surface that is electrically connected to electrical ground;
   a lead frame structure comprising at least a first section supporting the first semiconductor die and a second section supporting the second semiconductor die, the first semiconductor die having a bottom surface that is on the first section of the lead frame structure, the second semiconductor die having a bottom surface that is on the second section of the lead frame structure; and
   a third semiconductor die that is vertically stacked on the second semiconductor die, the third semiconductor die comprising a control circuit and having a bottom surface that is attached to the top surface of the second semiconductor die.

2. The semiconductor device of claim 1 wherein the first and second sections of the lead frame are electrically isolated from each other.

3. The semiconductor device of claim 1 wherein the third semiconductor die is electrically connected to the first semiconductor die by a first bonding wire and to the second semiconductor die by a second bonding wire.

4. The semiconductor device of claim 1 wherein the first section of the lead frame structure comprises a first electrical lead that electrically couples the bottom surface of the first semiconductor die to a power supply voltage.

5. The semiconductor device of claim 4 wherein the second section of the lead frame structure comprises a second electrical lead that electrically couples the bottom surface of the second semiconductor die to a switching node.

6. The semiconductor device of claim 1 wherein the first switching device comprises a first high voltage field effect transistor and the second switching device comprises a second high voltage field effect transistor.

7. The semiconductor device of claim 6 wherein:
   the first semiconductor die comprises a lower layer having a drain of the first high voltage field effect transistor and an upper layer, the upper layer of the first semiconductor die comprising a large area having a source of the first high voltage field effect transistor and a small area having a gate of the first high voltage field effect transistor; and
   the second semiconductor die comprises a lower layer having a drain of the second high voltage field effect transistor and an upper layer, the upper layer of the second semiconductor die comprising a large area having a source of the second high voltage field effect transistor and a small area having a gate of the second high voltage field effect transistor.

8. The semiconductor device as described in claim 7, wherein, the large area of the upper layer of the first semiconductor die is electrically coupled to the second section of the lead frame structure via bonding wires.

9. A semiconductor device comprising:
   a first semiconductor flip-chip die comprising a first switching device, the first semiconductor flip-chip die having a top surface and a bottom surface, the bottom surface of the first semiconductor flip-chip die being electrically connected to electrical ground;

a second semiconductor flip-chip die comprising a control circuit, the second semiconductor flip-chip die being vertically stacked on the first semiconductor flip-chip die, a substrate of the second semiconductor flip-chip die being attached to the bottom surface of the first semiconductor flip-chip die; and a lead frame structure supporting the first semiconductor flip-chip die.

10. The semiconductor device of claim 9 wherein the first semiconductor flip-chip further comprises a second switching device, and the control circuit controls the first and second switching devices.

11. The semiconductor device of claim 10 wherein the first switching device comprises a first field effect transistor and the second switching device comprises a second field effect transistor.

12. The semiconductor device of claim 10 further comprising a third semiconductor flip-chip die supported by the lead frame structure.

* * * * *